United States Patent

Rambert

[11] Patent Number: 5,079,484
[45] Date of Patent: Jan. 7, 1992

[54] VOLTAGE-REGULATED SUPPLY, NOTABLY FOR MICROWAVE TUBES

[75] Inventor: Bernard Rambert, Chatillon Sous Bagneux, Fed. Rep. of Germany

[73] Assignee: Thomson-CSF, Puteaux, France

[21] Appl. No.: 441,267

[22] Filed: Nov. 27, 1989

[30] Foreign Application Priority Data

Nov. 30, 1988 [FR] France ................ 88 15672

[51] Int. Cl.$^5$ ........................................... H05B 37/00
[52] U.S. Cl. ................................... 315/173; 315/160; 307/77
[58] Field of Search ............. 315/173, 3.5, 105, 160; 330/43; 363/67, 68; 307/72, 77, 78

[56] References Cited

U.S. PATENT DOCUMENTS

| | | | |
|---|---|---|---|
| 1,951,416 | 1/1932 | Hund | 315/173 |
| 2,659,036 | 11/1953 | Needham | 307/72 |
| 3,697,799 | 10/1972 | Caldwell | 315/3.5 |
| 3,723,798 | 3/1973 | O'Brien | |
| 3,848,197 | 11/1974 | Boyd et al. | |
| 4,417,180 | 11/1983 | Chamran | 315/173 |
| 4,469,981 | 9/1984 | Ruff | 315/173 |
| 4,571,536 | 2/1986 | Kuwahara | 323/311 |
| 4,602,322 | 7/1986 | Merrick | 323/311 |
| 4,751,408 | 6/1988 | Rambert | 307/574 |
| 4,899,113 | 2/1990 | Buikema | 315/3.5 |

FOREIGN PATENT DOCUMENTS

2358015 2/1978 France.
58-154138 9/1983 Japan.

*Primary Examiner*—Eugene R. LaRoche
*Assistant Examiner*—Amir Zarabian
*Attorney, Agent, or Firm*—Oblon, Spivak, McClelland, Maier & Neustadt

[57] ABSTRACT

A supply unit for a tube of the type requiring both a cathode supply and a collector supply, notably for a travelling wave tube. The tube features a collector biasing device, working essentially as a voltage source, delivering a weakly regulated or unregulated and weakly filtered or unfiltered voltage between the collector and the cathode, and having one of its terminals connected to the cathode and the other terminal connected to the collector. Also, a cathode biasing device is featured for delivering a highly regulated and highly filtered voltage to the cathode so as to keep the potential of the cathode constant at its chosen point of operation. A charge storage capacitor, one armature of which is connected to the cathode and the other to ground, is also included. This supply unit operates such that the cathode biasing device has one of its terminals connected to the collector and the other to ground, and the collector biasing device is series mounted with the cathode biasing device and interposed so that the cathode voltage is equal to the sum of the voltages delivered respectively by the collector biasing device and the cathode biasing device. In this way, the cathode biasing device, while essentially achieving the regulation of the cathode voltage by itself, delivers a voltage that is notably lower than the cathode voltage and a power that is notably lower than the cathode power.

4 Claims, 2 Drawing Sheets

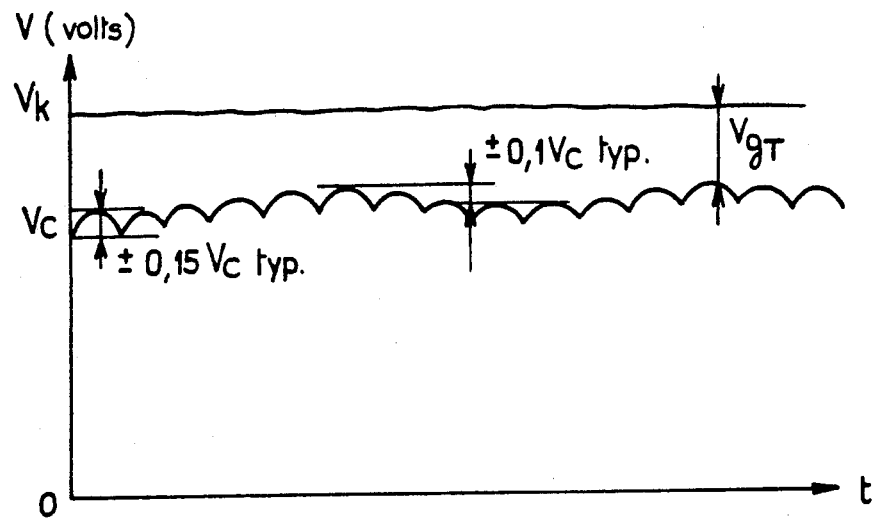
FIG_3
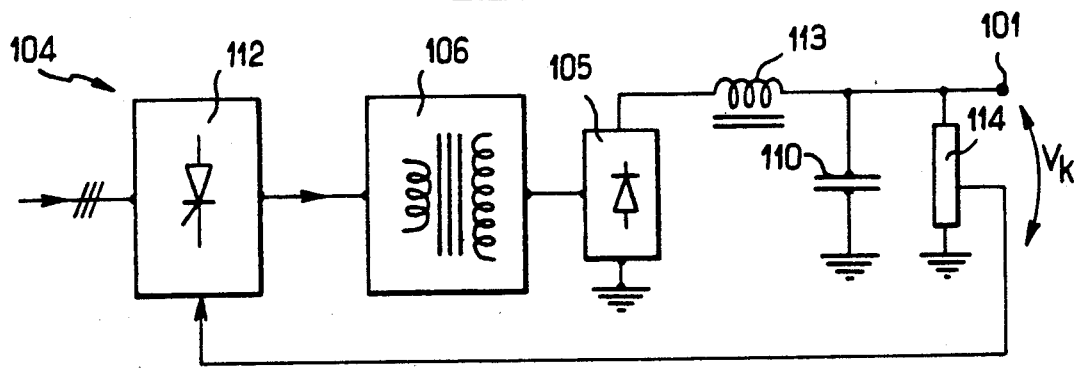
FIG_4 PRIOR ART
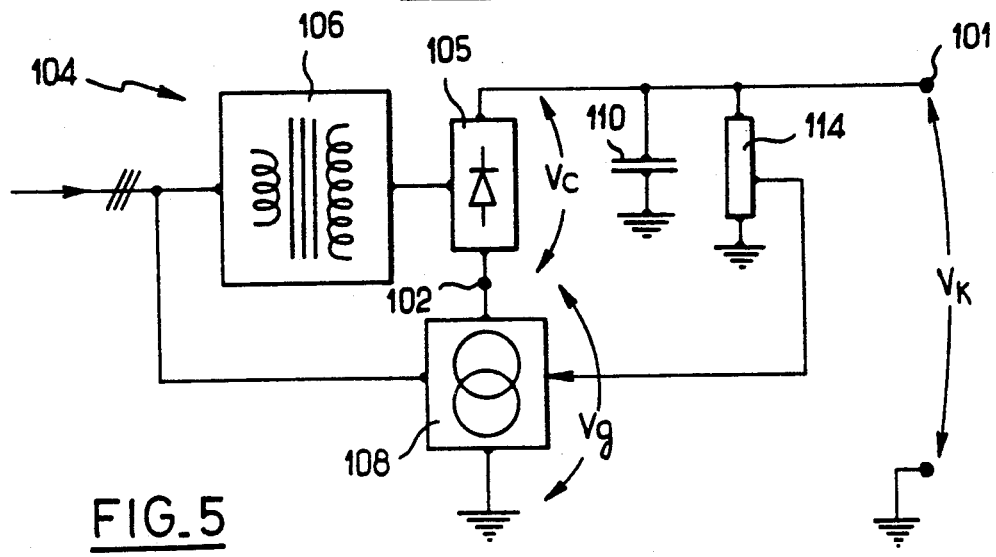
FIG_5

VOLTAGE-REGULATED SUPPLY, NOTABLY FOR MICROWAVE TUBES

BACKGROUND OF THE INVENTION

1. Field of the Invention

The present invention concerns voltage-regulated supplies, especially supplies for microwave amplifier tubes which require both a cathode supply and a collector supply, as is the case, for example, with TWTs (travelling wave tubes).

In these tubes a microwave, in order to be amplified, is made to interact with an electron beam.

This electron beam is accelerated by a very high cathode voltage, which is typically of the order of 40 to 50 kV. At the end of its interaction with the microwave, the beam still has high kinetic energy which may be:

either dissipated by the heating of a collector electrode connected to the ground and struck by the beam after interaction (this is typical in klystrons);

or recovered in making the beam cross a potential barrier or "depression" created by taking the collector electrode to a given potential (this is typical in TWTs). This collector potential is not zero (otherwise we return to the previous case) but is smaller than the cathode potential.

In the latter case, the tube, which is called a "depressed collector" tube requires two distinct supplies:

firstly, a very high voltage supply, but one with low power (for example a 40 kV/1200 W supply) with the task of achieving a biasing, with respect to the ground, of the cathode at the potential enabling the electron beam to be accelerated to make it interact with the microwave. It suffices for this supply to be a relatively low power supply, for its essential role is to bias the cathode with respect to the ground without a great flow of current between the cathode and the ground: for, the major part of the electron beam moves between the cathode and the collector and, between the cathode and the ground, there is a flow of only a relatively low current which is a leakage current due to the imperfections of the tube (this leakage current between the cathode and the ground generally does not exceed 20% of the total current).

secondly, a high voltage supply, but one with high power (for example 30 kV/5000 W) designed to put the collector into depression by biasing it with respect to the cathode. Since it is desired to "pump out" the major portion of the electron charges recovered at this collector to make them move again towards the cathode, this second supply should give a relatively high current, whence its relatively high power.

2. Description of the Prior Art

Until now, it has been common to use only one supply unit for the high collector voltage and the very high cathode voltage, the two voltages being obtained from two stages of one and the same voltage generator.

However, an approach such as this requires supplies of very high quality as regards both the residual voltage noise and the stability of the potential delivered.

For, while the collector has little sensitivity to the voltage noise (notably the mains noise resulting from an incomplete filtering), since its only role is to make the unused charges of the electron beam flow again, by contrast the cathode supply calls for a very high voltage that is extremely stable and extremely well filtered (typically a noise smaller by −30 dB than the noise permissible on the collector) so as not to degrade the quality of the microwave amplified by the tube.

As for the stability required, it is of the order of 1% of the cathode potential. By contrast, it suffices to apply a voltage of approximately zero to one-third of the cathode voltage to the collector to obtain satisfactory operation, the sole drawback of an excessively low collector voltage being an increase in the heating of the collector (if the supply to this collector is insufficient, it will not be possible to recover all the kinetic energy of the beam, and hence a portion of this energy will be discharged as heat).

SUMMARY OF THE INVENTION

It is an object of the invention to overcome these drawbacks by proposing a supply unit comprising biasing means differentiated according to the electrodes, having, on the one hand, a first part designed to supply the collector, the first part being high-powered and capable of accepting a high level of pollution in terms of noise and instability and, secondly, a second part designed for the supply of the cathode, with low power and low pollution.

More precisely, the supply unit of the invention comprises, in a manner known per se:

collector biasing means, working essentially as a voltage source, delivering a weakly regulated or unregulated and weakly filtered or unfiltered voltage between the collector and the cathode, this means having one of its terminals connected to the cathode and the other terminal connected to the collector;

cathode biasing means, delivering a highly regulated and highly filtered voltage to the cathode so as to keep the potential of the cathode constant at its chosen point of operation, and a charge storage capacitor, one armature of which is connected to the cathode and the other to the ground.

According to the invention, this supply unit is such that:

the cathode biasing means has one of its terminals connected to the collector and the other to the ground, and the collector biasing means are series mounted with the cathode biasing means and interposed between these means and the cathode so that the cathode voltage is equal to the sum of the voltages delivered respectively by the collector biasing means and the cathode biasing means.

In this way, the cathode biasing means, while essentially achieving the regulation of the cathode voltage by itself deliver a voltage that is notably lower than the cathode voltage and a power that is notably lower than the cathode power.

In other words, to bias the cathode, a cathode supply (voltage applied directly between cathode and ground) is replaced by a collector supply acting indirectly on the cathode.

For, the collector supply, which is set up between the cathode and the collector, is thus floating with respect to the ground, so that it can be used to indirectly bias the cathode.

Through a composite system such as this, formed by two series-mounted generators, the collector supply shifts the rang of the operating voltages of the cathode supply towards the high voltages. Hence, this cathode supply, while providing for an equally efficient automatic control system, can work both with a far lower voltage (for example a maximum of one-third of the cathode voltage) and with a lower power—this power being reduced in the ratio of the voltages.

Very advantageously, the cathode biasing means work essentially as a current source, automatically controlled by the cathode voltage.

The cathode supply thus formed by a current generator may thus oblige the composite system formed by the two series-mounted generators (one of which is not automatically controlled) to work on the whole as a current generator, with the advantages derived therefrom owing to more efficient regulation; in effect, a current generator (unlike a voltage generator) procures a first-order response and hence reacts with far greater speed to the different variations.

This latter characteristic is especially important for radar tubes where the supply has to follow major variations in the form factor.

The principle of the invention, which has just been explained for the supply of a radar tube, may be transposed to the supply of any loads, the general idea being the series mounting of a current source with a voltage source to obtain a current generator with amplified power.

In a generalization such as this:
the cathode corresponds to an output node and the collector to a midpoint;
the collector biasing means correspond to a first source, working essentially as a voltage source which is weakly regulated or unregulated and weakly filtered or unfiltered;
the cathode biasing means correspond to a second source, working essentially as a current source, which is highly regulated and highly filtered but has a voltage notably lower than the voltage of the output node and has power notably lower than the output power.

BRIEF DESCRIPTION OF THE DRAWINGS

Other characteristics and advantages of the invention will appear from the following detailed description, made with reference to the appended drawings, wherein:

FIG. 3 shows the variation in the different voltage levels on the collector and the cathode in the course of time;

FIG. 4 shows a diagram of a prior art supply, in the case of an extension to any load;

FIG. 5 shows a diagram homologous to that of FIG. 4, illustrating a supply achieved according to the teachings of the present invention.

DESCRIPTION OF THE PREFERRED EMBODIMENTS

Figure 1:
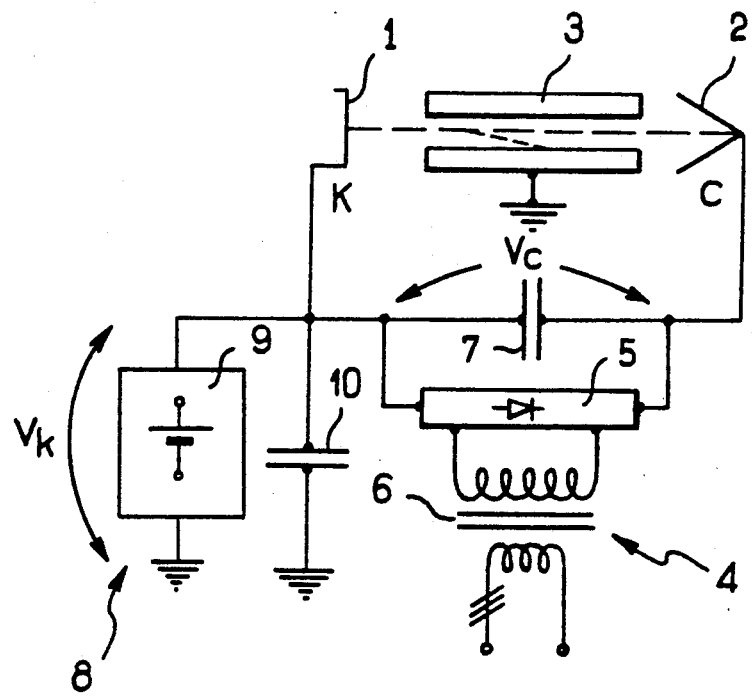
FIG. 1 shows a diagram of a microwave tube supply according to the prior art.

FIG. 1 shows a tube of the depressed collector type and its supply according to the prior art.

The tube essentially comprises a cathode 1 accelerating an electron beam in order to make it interact with a microwave so as to amplify this microwave, and a collector electrode 2 struck by the beam after interaction. Owing to the imperfections of the tube, a small fraction of the beam (about 20%) also strikes a ground electrode 3.

To recover the kinetic energy of the beam striking the collector 2, this collector 2, instead of being grounded, is "put into depression" with respect to the cathode, i.e., a potential barrier is created through collector biasing means 4, working essentially as a voltage generator, producing a voltage Vc between the collector and the cathode and thus making the charges recovered at the collector flow again to send them to the cathode.

Because their sole role is to provide for this resumed flow of charges, the collector biasing means has little or no need to be regulated and filtered.

It is then possible to use, for this purpose, a simple rectifier bridge 5 powered by a transformer 6. If a three-phased or hexaphased rectification and a transformer with a fairly high leakage inductance are used, the residual ripple will be of the order of a few per cent, which is a perfectly acceptable value.

The absence of regulation of the collector supply is not inconvenient. The only drawback of an insufficient voltage Vc will be an inability to recover all the kinetic energy of the beam striking the collector, thus causing it to be heated. It is therefore enough to size the collector electrode as a function of foreseeable voltage variations. It may be noted that the tube can work even with a zero voltage Vc but, in this case, the heating of the collector will be the maximum (and we thus return to the particular case of the klystrons, where the collector is grounded by its construction).

Optionally, depending on the nature of the collector currents (DC or PC, with sharp or slow variation), it is also possible to provide for a charge storage capacitor 7 which will improve the overall performance characteristics in case of high repetition frequency and critical form factor.

As regards the cathode 1 electrode, it is biased by cathode biasing means 8 formed by a voltage generator 9 producing a very high voltage Vk applied between the cathode and the ground.

A charge storage capacitor 10 makes it possible, as in the case of the capacitor 7, to have a satisfactory pulsed operation.

Unlike the collector biasing means, the cathode biasing means 8 should be both highly filtered and highly stabilized, for they determine the microwave operating frequencies of the tube.

Besides, the voltage Vk produced should be a very high voltage (for example of the order of 40 kV), far higher than the bias voltage Vc of the collector (typically, at least three times this voltage).

By contrast, the power that should be given by the cathode biasing means 8 is smaller than the power that should be given by the collector biasing means 4 since, as can be seen in the diagram, the means 8 will only have to recycle the leakage current between the cathode 1 and the ground electrode 3, and this current corresponds to only about 20% of the total flux of electrons of the beam.

The ratio of the power values of the two supplies 4 and 8 is thus, generally, of the order of 80%/20%.

However, despite this lower power, the cathode supply 8 remains costly to make and unreliable, because it has to get an extremely fine regulation both on a very high voltage and with a power which, although it is relatively lower than that of the supply 4, represents, in absolute terms, a high value in a great many applications (for, the 20% of the current flowing between the cathode and the ground may represent a mean power value of the order of 1200 W).

Furthermore, the regulated voltage sources generally have fairly low performance characteristics for, owing to the risks of locking, it is necessary to provide for a low-pass filtering in the feedback means, the drawback of which is that it reduces the speed of response of the voltage automatic control.

To overcome these different drawbacks, the present invention propose to modify the supply diagram of FIG. 1 in such a way that the cathode biasing means works both on a lower voltage and with a far lower power and can therefore be formed by circuits that are far less costly and more reliable than in the prior art.

Figure 2:
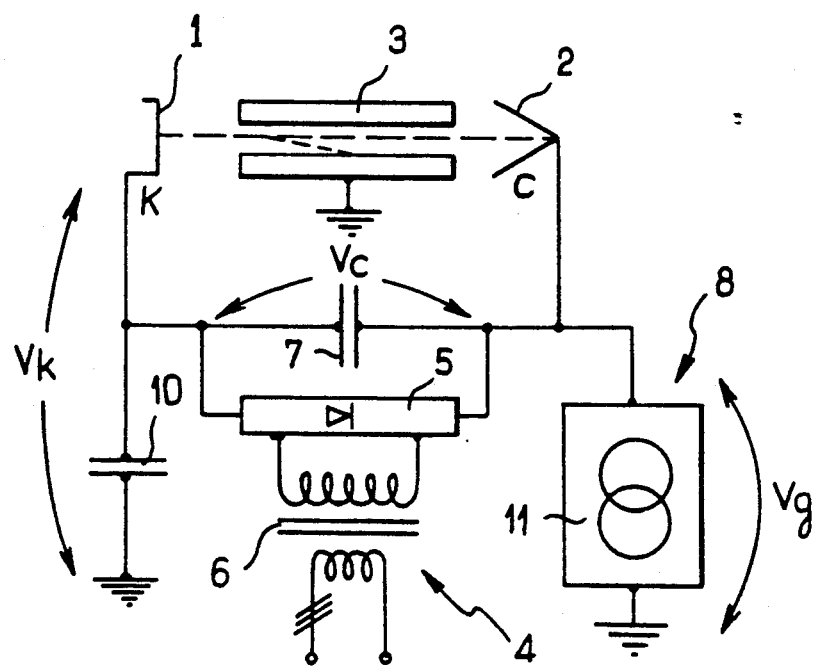
FIG. 2 shows a diagram homologous to that of FIG. 1, illustrating a supply unit according to the present invention.

FIG. 2 illustrates the modified circuit.

In this circuit, the cathode biasing means 8 has been shifted so that it is mounted no longer between the cathode and the ground but between the collector and the ground. The cathode 1 is therefore no longer forward biased, as was the case in FIG. 1, but is indirectly biased by the two collector and cathode biasing means, 4 and 8 respectively, mounted in series.

Besides, preferably, the cathode 8 biasing means is formed no longer by a voltage generator but by an automatically controlled current generator, i.e. one in which there is actuated the injection of a current proportionate to the difference between the real cathode voltage Vk and its set value.

this type of regulation by current control has a first-order response and, therefore, presents no risk of locking, and there is therefore no need to restrict its pass band, so that it will be a great deal faster and will accept all the variations of the form factor of the radar signals considered without difficulty.

If we consider the diagram of FIG. 2, it is seen that the totality of the current injected (at the collector node) by the current generator 11 will be recovered at the terminals of the capacitor 10 (at the cathode node). This diagram thus enables the control of the currents at the cathode node without it being necessary to have a current generator working at the very high cathode voltage available.

The advantage of this composite system with two series-mounted generators is twofold.

A first advantage is that it reduces the voltage vG that has to be produced by the cathode biasing means 8 since the collector biasing means 4, mounted in series, shifts the range of operating voltages of the current generator 8 towards the high voltages.

This "elevator effect" is illustrated in FIG. 3 where it is seen that, to regulate Vk, it suffices to control the voltage Vg, which is far lower than the voltage Vk.

For example, for Vg, a voltage of about one-third of the voltage Vk is chosen. This ratio is not of vital importance but is designed solely to preserve a safety margin with respect to the residual humming voltage (typically of the order of +15% of Vc) and the instabilities of this same voltage Vc (typically of the order of +10%) which, therefore, in getting added up, can produce variations reaching 25%. If Vg/Vk=33%, it will be certain that the collector will be always depressed.

A first advantage is that it reduces the power delivered by the cathode biasing means in the ratio of the voltages.

Thus, about 95% of the power delivered to the tube is given by a unregulated mains supply, and only 5% of the power is delivered by a regulated supply which furthermore works at a relatively low voltage.

These advantages are particularly significant in the case of supplies for radar tubes where, for reasons of synchronism, it is necessary to provide for the regulation of the switched supplies operating at very high working frequencies of the order of 50 to 120 kHz.

For, it is extremely difficult and therefore expensive to achieve switched supplies that have both high power and high switched frequency, these being conditions that are imperative for radar tube supply.

The present unit thus enables, for example, the reduction of the regulated electrical power from 6 kW to 300 W, the rest being ensured, for example, by an unregulated very high voltage mains unit.

The principle of the invention that has just been explained, for the supply of a radar tube, may be extended to the supply of any loads, the general idea being the series-connection of a regulated current source with an unregulated voltage source to obtain a current generator with amplified power.

This extension is illustrated in FIGS. 4 and 5 which are homologous to FIGS. 1 and 2. Elements fulfilling similar roles have been given the same numerical references to which the value 100 has been added (for example, the rectifier bridge 105 of FIGS. 4 and 5 corresponds to the rectifier bridge 5 of FIGS. 1 and 2).

The regulated supplies of the prior art, shown schematically in FIG. 4, generally use a transformer 106, a mains regulation unit 112 at the primary of this transformer, working as a voltage generator and, at the secondary, a rectifier device 105 and a filtering cell with an inductance 113 and a capacitor 110. A divider bridge 114 taps the voltage Vk at the output node 101 to control the regulation 112 which is, for example, a switched system with a variable cyclical ratio.

If we apply the teachings of the present invention, it is possible to modify a supply system such as this by eliminating the mains regulation 112 (which should be sized as a function of the total power liable to be delivered by the supply system).

To this effect, a current generator 108 automatically controlled by the voltage at the output node 101, is series mounted with the rectifier bridge 105.

It is seen that the diagram of FIG. 2 is got again, with the output node 101 playing the role of the cathode 1 electrode, the midpoint 102 (unused herein) between the rectifier bridge 105 and the current generator 108 playing the role of the collector, the current generator 108 playing the role of the cathode biasing means 8, and the set 104 formed by the transformer 106 and the rectifier bridge 105 playing the role of the collector biasing means 4.

The filtering inductance 113 may be eliminated, and the smoothing role which fell to it is then fulfilled by the current generator 108 interposed in series in the secondary circuit.

The advantage is that the power that can be given by a given supply is tripled without yielding any of the quality of the regulation.

Finally, the mains transformer 106 works efficiently and on only one part of the power to be given. This results, here again, in a substantial reduction in its bulk.

This transformer 106 may be a simple autotransformer or may even be eliminated depending on the application considered.

The current generator 108 may be formed by a switched supply with relatively low voltage, hence one that is simpler and less costly, the basic original voltage being essentially delivered to the terminals of the rectifier bridge 105.

It is possible to provide for a voltage Vg, given by the generator 108, which is of the order of one-third or less of the output voltage Vk of the supply, the sole condition being that the range in voltage of the series current generator 108 should be capable of adapting itself to variations (instability, humming) of the unregulated voltage source 105.

What is claimed is:

1. A supply unit for a tube of the type requiring both a cathode supply and a collector supply, notably for a travelling wave tube including a cathode and a collector, comprising:
    collector biasing means, working essentially as a voltage source, delivering a substantially unregulated and substantially unfiltered first voltage between said collector and said cathode, said collector biasing means having tow terminals, one of which is connected to the cathode and the other to the collector;
    cathode biasing means having two terminals, one connected to said collector and the other connected to the ground, and delivering a highly regulated and highly filtered second voltage so as to keep the potential of the cathode constant at its chosen point of operation, the collector biasing means being series mounted with the cathode biasing means and interposed between the cathode biasing means and said cathode so that the cathode voltage is equal to the sum of said first and second voltages delivered respectively by the collector biasing means and the cathode biasing means, and
    a charge storage capacitor with two armatures, one armature of which is connected to the cathode and the other to the ground so that said cathode biasing means, while essentially achieving the regulation of the cathode voltage by themselves, deliver said second voltage which is notably lower than the cathode voltage and a power notably lower than the cathode power.

2. The supply unit of claim 1, wherein said cathode biasing means work essentially as a current source, automatically controlled by said cathode voltage.

3. A voltage-regulated supply with a midpoint and an output node, comprising:
    a first source working essentially as a voltage source, delivering a substantially unregulated and substantially unfiltered first voltage between said midpoint and said output node, this first source having two terminals, one of which is connected to the output node and the other to the midpoint;
    a second source having two terminals, one connected to said midpoint and the other connected to the ground, and delivering a highly regulated and highly filtered second voltage so as to keep the potential of the output node constant at its chosen point of operation, the first source being series mounted with said second source and being interposed between this second source and said output node so that the voltage of this output node is equal to the sum of said first and second voltages delivered respectively by the first source and second source; and
    a charge storage capacitor with two armatures, one armature of which is connected to the output node and the other to the ground so that said second source, while essentially achieving the regulation of the voltage at the output node by itself, delivers said second voltage which is notably lower than the voltage of this output node and a power notably lower than the output power.

4. The supply unit of claim 3, wherein said second source works essentially as a current source, automatically controlled by said voltage of the output node.

* * * * *

UNITED STATES PATENT AND TRADEMARK OFFICE
CERTIFICATE OF CORRECTION

PATENT NO. : 5,079,484

DATED : January 7, 1992

INVENTOR(S) : Bernard Rambert

It is certified that error appears in the above-identified patent and that said Letters Patent is hereby corrected as shown below:

On the Title page, item [54], The Inventor's country is incorrect, should be, --France--.

Signed and Sealed this

Twenty-fifth Day of May, 1993

Attest:

MICHAEL K. KIRK

Attesting Officer

Acting Commissioner of Patents and Trademarks